United States Patent
Rapolder et al.

(10) Patent No.: US 12,495,616 B2
(45) Date of Patent: Dec. 9, 2025

(54) METHOD FOR MONITORING A SWITCHABLE SEMICONDUCTOR COMPONENT AND MONITORING DEVICE FOR A SEMICONDUCTOR COMPONENT

(71) Applicant: Lisa Draexlmaier GmbH, Vilsbiburg (DE)

(72) Inventors: Thomas Rapolder, Ebersberg (DE); Michael Wortberg, Dorfer (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 732 days.

(21) Appl. No.: 17/869,110

(22) Filed: Jul. 20, 2022

(65) Prior Publication Data

US 2023/0025128 A1 Jan. 26, 2023

(30) Foreign Application Priority Data

Jul. 21, 2021 (DE) ...................... 10 2021 118 817.2

(51) Int. Cl.
*H10D 89/60* (2025.01)
(52) U.S. Cl.
CPC ......... *H10D 89/611* (2025.01); *H10D 89/911* (2025.01); *H10D 89/931* (2025.01)
(58) Field of Classification Search
CPC .. H10D 89/611; H10D 89/911; H10D 89/931; H03K 2217/0027; H03K 17/18
See application file for complete search history.

(56) References Cited

U.S. PATENT DOCUMENTS

| 4,303,957 | A | * | 12/1981 | Bell, Jr. | ................. | B23H 1/024 |
| | | | | | | 219/69.19 |
| 6,967,454 | B1 | * | 11/2005 | Braun | .................... | H02P 29/02 |
| | | | | | | 318/563 |
| 2006/0232904 | A1 | * | 10/2006 | Wu | ........................ | G11C 17/18 |
| | | | | | | 361/104 |
| 2013/0120030 | A1 | * | 5/2013 | Kora | .................. | H03K 17/0822 |
| | | | | | | 327/109 |
| 2021/0270911 | A1 | * | 9/2021 | Kageyama | .......... | H02M 1/0009 |
| 2021/0344335 | A1 | * | 11/2021 | Chen | .................. | H03K 17/0828 |

FOREIGN PATENT DOCUMENTS

| DE | 102011056547 | 6/2012 |
| DE | 102017219897 | 5/2019 |

* cited by examiner

*Primary Examiner* — Lee E Rodak
*Assistant Examiner* — Zannatul Ferdous
(74) *Attorney, Agent, or Firm* — Burris Law, PLLC

(57) ABSTRACT

A method for monitoring a switchable semiconductor component having a protective circuit connected in parallel to the semiconductor component includes tapping an electrical variable applied to the semiconductor component and the protective circuit, and detecting damage to the semiconductor component and/or the protective circuit when an electrical variable is greater than a previously known critical value.

9 Claims, 1 Drawing Sheet

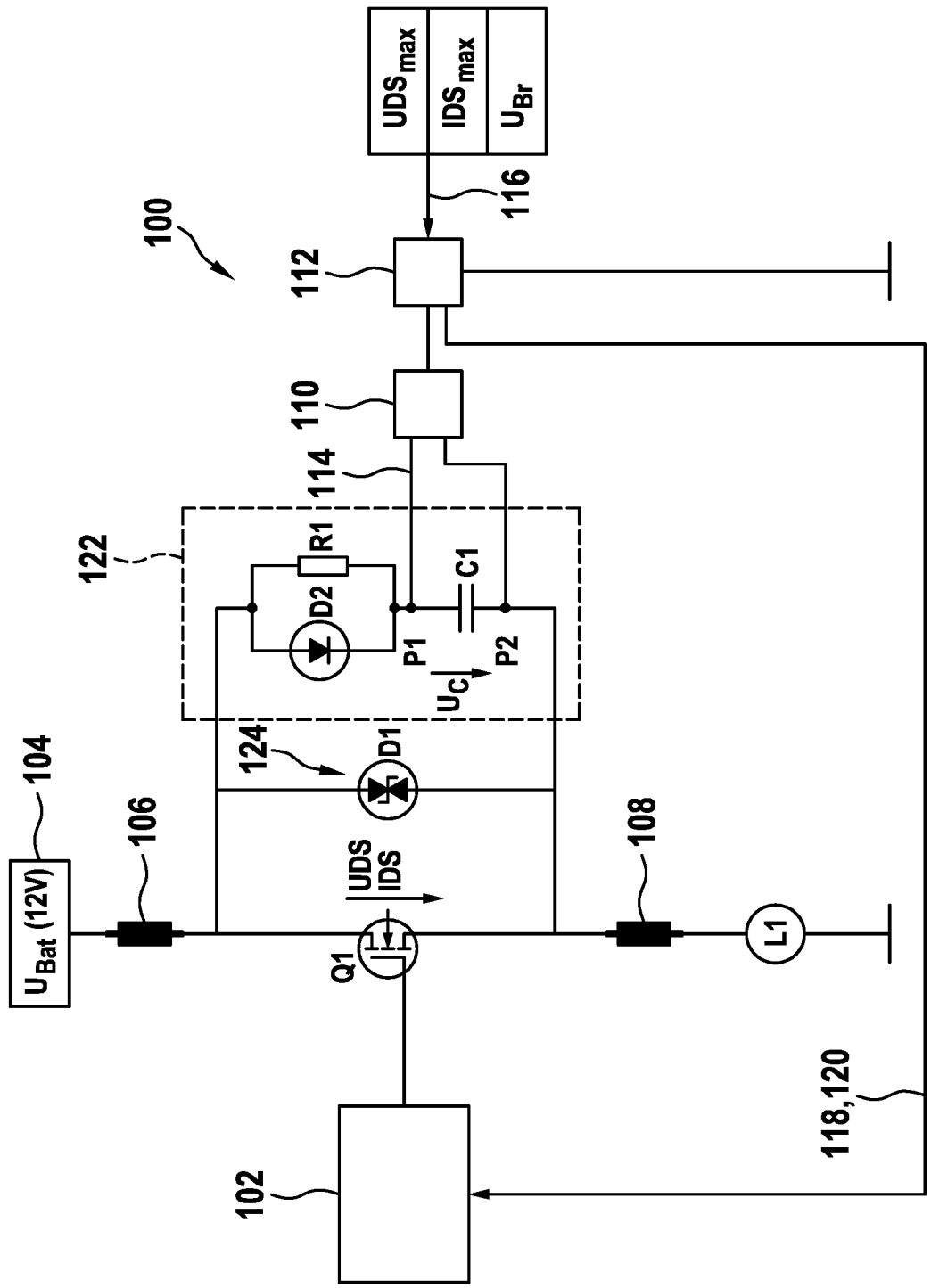

METHOD FOR MONITORING A SWITCHABLE SEMICONDUCTOR COMPONENT AND MONITORING DEVICE FOR A SEMICONDUCTOR COMPONENT

CROSS-REFERENCE TO RELATED APPLICATIONS

This application claims priority to and the benefit of German Patent Application DE 10 2021 118 817.2, filed on Jul. 21, 2021. The disclosures of the above applications are incorporated herein by reference.

FIELD

The present disclosure relates to a method for monitoring a switchable semiconductor component as well as a monitoring device for a semiconductor component.

BACKGROUND

The statements in this section merely provide background information related to the present disclosure and may not constitute prior art.

An overvoltage can occur due to load inductance during switch off in a semiconductor component which switches an inductive load. The inductance acts here as an energy storage which is discharged during switch off.

The overvoltage can be so high that the semiconductor component can be damaged during switch off. The overvoltage can especially be higher than a breakdown voltage of the semiconductor component. Charge carriers in the semiconductor component break then like an avalanche through an actually blocking layer of the semiconductor component. High current strengths can be reached in the event of the avalanche breakdown. The semiconductor component can become very hot and be irreversibly thermally damaged due to the high current strengths.

The semiconductor component can possibly be conductively switched once more, but a new switch-off process may, however, be impossible.

The semiconductor component can be used, for example, to activate and deactivate an autonomous or partially autonomous function of an electric vehicle. If the semiconductor component is damaged, the function can no longer be reliably switched off.

A protective circuit can be connected in parallel with the semiconductor component in order to inhibit a reaching of the breakdown voltage. The protective circuit is conductive at a lower voltage than the breakdown voltage of the semiconductor component. If the overvoltage is greater than a design voltage of the protective circuit, the overvoltage can be relieved via the protective circuit.

SUMMARY

This section provides a general summary of the disclosure and is not a comprehensive disclosure of its full scope or all of its features.

The present disclosure is described in the following primarily in connection with switchable semiconductor components.

The present disclosure provides an improved method for monitoring a switchable semiconductor component as well as an improved monitoring device for a semiconductor component using the simplest possible constructive means.

An improvement can relate herein, for example, to an improved detection of component damage.

In the approach presented here, a level of an overvoltage is measured at a semiconductor component, and it is detected, based on stored maximum values for the semiconductor component, whether damage of the semiconductor component has highly probably occurred.

The approach presented here can be particularly used in an electric vehicle in order to safeguard critical functions of the electric vehicle. A critical function can be, for example, an autonomous or partially autonomous driving operation of the electric vehicle. The critical function can, for example, no longer be made available if the semiconductor component has highly probably been damaged during the last switch-off process. Uncontrollable situations can thus be reliably reduced.

A method for monitoring a switchable semiconductor component having a protective circuit connected in parallel to the semiconductor component is proposed, wherein an electrical variable applied on the semiconductor component and the protective circuit is tapped, and damage to the semiconductor component and/or the protective circuit is detected when the electrical variable is greater than a known critical value.

A monitoring device for a semiconductor component having a protective circuit connected in parallel to the semiconductor component is furthermore proposed, wherein the monitoring device is connected in parallel to the semiconductor component and the protective circuit, wherein an tapping device of the monitoring device is configured for the purpose of tapping an electrical variable given at the semiconductor component and the protective circuit, and an evaluating device of the monitoring device is configured for comparing the electrical variable to an already known critical value in order to detect damage to the semiconductor component and/or the protective circuit.

In one form, a switchable semiconductor component can be understood to be, for example, a transistor or thyristor. The semiconductor component can particularly be a MOSFET. The semiconductor component can be used for switching on and switching off an electrical load. The semiconductor component can be arranged, in one form, between the load and an energy source. The semiconductor component can be electrically activated by a control system. In one form, the semiconductor component can be conductively switched by applying a control voltage on a control terminal (gate) of the semiconductor component. If the control voltage is interrupted, the semiconductor component is connected in a blocking manner.

The semiconductor component can have an operating range determined by its design. The semiconductor component can be especially configured for a maximum transmissible electrical current flow and a maximum lockable electrical voltage. The limits of the operating range can be stored as critical values. In the event of a current flow greater than the maximum transmissible current flow, the semiconductor component can overheat. In the event of a voltage greater by a safety factor than the maximum lockable voltage, an avalanche breakdown can occur through a blocking range of the semiconductor component.

The current flow and the voltage at the semiconductor component are detectable electrical variables. The current flow or the voltage can be measured and reproduced as current flow value or voltage value. The current flow or the voltage can in particular be digitized. The current flow value or voltage value can be compared to the corresponding critical value in order to detect the possible damage.

The monitoring device can include a storage device for storing a maximum of the electrical variable. The tap device can be connected in parallel to a storage component of the storage device. The tap device can be configured for tapping the maximum stored in the storage component as the electrical variable in a time-delayed manner. The maximum of the electrical variable can be stored in particular during a switch off of the semiconductor component using the storage device connected in parallel to the semiconductor component. The maximum can be tapped at the storage device in a time-delayed manner. Damage can be detected when the maximum is greater than the critical value. A storage device can be referred to as a sample & hold unit.

The storage device can include a diode, a resistor connected in parallel to the diode, and a capacitor connected in series to the diode and the resistor. The capacitor can be the storage component of the storage device. The tap device can be connected in parallel to the capacitor and tap a voltage applied on the capacitor. The storage device can store the maximum of the voltage independently of a time of its occurrence since the storage device is continuously connected to the semiconductor component. In other words, the storage device can be analog. The tapping device can include an analog-to-digital converter. The tapping device can be read out in a clocked manner. A digitization time-point of the tapping device can be delayed with respect to the maximum. The maximum can be stored by the storage device up to the read-out time-point. This is particularly advantageous since the measurement variable, here the peak of the drain-source voltage of the switchable semiconductor element (MOSFET) is only applied for a few µs and a temporally coincident measurement is thus not possible.

If a voltage which implies an avalanche breakdown (approx. 45V with 40V MOSFETS) is measured by the monitoring circuit via the switchable semiconductor element, then damage to the protective circuit can be inferred. When damage is detected, a damage message can be emitted. The damage message can be stored in the control system of the semiconductor component. A repair, for example, can be initiated promptly based on the damage message.

A future use of the semiconductor component can be inhibited by a blocking note on a control system of the semiconductor component when the damage is detected. The load connected by the semiconductor component can no longer be used after the damage in order inhibit an uncontrolled state. Functions critical for the safety of a vehicle, for example, can be disabled thereby after the damage has been detected.

The protective circuit can comprise a suppressor diode connected in parallel to the semiconductor component. An electrical voltage can be tapped at the suppressor diode. Damage to the suppressor diode can be detected if the voltage is greater than a breakdown voltage plus a permitted voltage tolerance of the suppressor diode. A suppressor diode can be referred to as a transil diode. The suppressor diode can become conductive starting at a breakdown voltage without external activation. The breakdown voltage of the suppressor diode can be lower than a breakdown voltage of the semiconductor component. A voltage can thereby be reduced via the suppressor diode, and current can flow thereby through the suppressor diode if the applied voltage is greater than the breakdown voltage of the suppressor diode, but still lower than the breakdown voltage of the semiconductor component.

Damage to the suppressor diode can be detected when the voltage is greater by a voltage tolerance than the breakdown voltage plus a permitted voltage tolerance of the suppressor diode. The suppressor diode can withstand a higher voltage than its breakdown voltage. False positives of damage can be reduced by means of a voltage tolerance. The voltage tolerance can be lower than a difference between the breakdown voltage of the semiconductor component and the breakdown voltage of the suppressor diode.

Damage to the semiconductor component can be detected when the voltage is greater by a tolerance than a dielectric strength of the semiconductor component. The dielectric strength plus tolerance can in particular correspond to a breakdown voltage of the semiconductor component. The semiconductor component can be damaged when its breakdown voltage is reached. When the breakdown voltage is achieved and the breakdown occurs, the semiconductor component can in particular heat more than is intended.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

An advantageous aspect of the present disclosure will be described below with reference to the accompanying FIGURE, wherein:

FIG. 1 shows a circuit diagram of a monitoring device for a semiconductor component, according to the teachings of the present disclosure.

The FIGURE is merely a schematic representation and serves only to explain the present disclosure. Identical or identically functioning elements are consistently provided with the same reference numerals.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a circuit diagram of a monitoring device 100 for a semiconductor component Q1 according to an aspect of the present disclosure. The semiconductor component Q1 is here a switchable MOSFET and is controlled via a control system 102. The semiconductor component Q1 is arranged between an energy source 104 for electrical energy and a load L1. The load L1 can be an inductive load L1.

A wiring harness 106 is arranged between the energy source 104 and the semiconductor component Q1. A wiring harness consumer 108 is arranged between the semiconductor component Q1 and the load L1. The wiring harness terminal 106 and the wiring harness consumer 108 can each have an individual inductance.

The energy source 104 can be, in one form, a battery of an electric vehicle having a battery voltage UBat. The battery voltage UBat can be, for example, 12 volts. The load L1 can be, in one form, a functional module of the electric vehicle. The load L1 can especially be a functional module for an autonomous or partially autonomous operation of the electric vehicle.

When the semiconductor component Q1 is conductively switched by the control system 102, the load L1 is electrically conductively connected to the energy source 104 via the wiring harness terminal 106, the semiconductor component Q1, and the wiring harness consumer 108.

The semiconductor element Q1 safeguards the line for the load L1 against short circuit in order to inhibit a thermal overload of the line. When a short circuit occurs on the line for the load or in the load itself, the current increases very rapidly. If the current exceeds a switch-off current threshold, the semiconductor component Q1 is switched in a locking manner by the control system 102. When the load path is interrupted by a short circuit, the inductances of the load line 108 and of the supply line 106 are suddenly discharged. An electrical voltage UDS at the semiconductor component Q1 briefly increases thereby over the battery voltage UBat. A voltage peak occurs as a result. A level of the voltage peak is dependent on the inductances and the supply line 106 and the load line 108.

When the voltage UDS is greater by more than a tolerance than a than a dielectric strength UDSmax of the semiconductor component Q1, a so-called avalanche breakdown occurs in the semiconductor component Q1, and the voltage peak is degraded by the actually blocked semiconductor component Q1. A great power Pv=I_K*breakdown voltage of the semiconductor element can briefly be converted thereby in the semiconductor element, wherein I_K corresponds to the current of the short-circuit switchoff threshold at the moment of switch off. This current flow decreases linearly until the energy W=½(L supply line+L load line) *I_K² stored in the inductances is relieved. The energy converted in the semiconductor element heats the semiconductor component Q1 and can damage the semiconductor component Q1 when the maximum blocking layer temperature of typically 170° C. is exceeded.

The monitoring device 100 is connected in parallel to the semiconductor component Q1. The monitoring device 100 includes a tapping device 110 and an evaluating device 112. The tapping device 110 is configured for tapping an electrical variable 114 at the semiconductor component Q1. The electrical variable 114 is the voltage UDS. The tapping device 110 is configured to digitize the electrical variable 114. The evaluating device 112 is configured for comparing a value of the electrical variable 114 to at least one stored critical value 116. The evaluating device 108 detects a likely damage to the semiconductor component Q1 if the electrical variable 114 is greater than the critical value 116.

When the electrical variable 114 is greater than the dielectric strength UDSmax plus tolerance or the current conductivity IDSmax of the semiconductor component Q1, the detected or likely damage to the semiconductor component Q1 is documented in a damage message 118 in one form. The damage can also only be documented when the electrical current flow IDS is greater by a tolerance than the current conductivity IDSmax. The damage message is stored, in one form, in the control system 102.

In one form, a blocking note 120 is transmitted to the control system 102 if damage is detected to block a renewed conductive switching of the semiconductor component Q1 by the control system 102 in order to inhibit a use of the previously damaged semiconductor component Q1.

In one form, the monitoring device 100 has a storage device 122. The storage device 122 is configured for storing a maximum of the electrical variable 114. The tap device 110 is connected here in parallel to a storage component C1 of the storage device 122. The storage component C1 is a capacitor, and the tapping device 110 taps a voltage Uc at the capacitor as electrical variable 114.

The storage device 122 further includes a diode D2 and a resistor R1. The diode D2 and the resistor R1 are connected in parallel to each other. The resistor R1 is very highly resistive and can discharge the capacitor in a few seconds so that it is available again for a new measurement. The discharge-time constant is selected by a factor typically 20 to 100 times higher than the maximum delay between switch-off time with voltage peak UDS and measuring via the tapping device 110. The diode D2 and the resistance R1 are connected in series to the storage component C1.

A protective circuit 124 is connected in parallel with the semiconductor component Q1 in one form. The protective circuit 124 is comprised here of a suppressor diode D1. The suppressor diode D1 has a lower breakdown voltage UBr than the dielectric strength UDSmax. The suppressor diode D1 has a higher energy-absorbing capacity than the semiconductor component Q1. Under design conditions, the dielectric peak can be diverted via the protective circuit 124 before the avalanche breakdown can damage the semiconductor component Q1. The suppressor diode D1 is not damaged in the event of short circuit due to the greater energy absorption capacity.

For a reliable design of the circuit, it is desirable to be able to diagnose the failure of the protective circuit. The protective circuit 124 can thus be thermally damaged due to an external influence, or a chance failure of the component can occur. In damaged state, the protective circuit 124 may possibly no longer be able to complete its task. This elevated load is registered by the monitoring device 100 and also documented in the form of a damage message 118.

In one form, the damage to the protective circuit 124 results in a blocking note 120 for the control system 102 since the switch off of the semiconductor component Q1 is no longer ensured by the damaged protective circuit 124.

In one form, the damage to the protective circuit 124 is detected if the electrical variable 114 is higher by a voltage tolerance than the breakdown voltage UBr, or higher than the current-carrying capacity of the protective circuit 124.

In other words, a diagnostic device is presented for the diagnosis of the protective circuit of semiconductor switching elements.

In current distributors, the combination of relay plus fuses for an electronic clamping circuit and conventional safeguard of the load channels can be replaced by MOSFET switches. In the case of a short-circuit shutdown in the active mode, the MOSFET can be damaged by a very high inductive overvoltage. The overvoltage can be so high that the MOSFETs are irreversibly damaged and can no longer disconnect under certain circumstances. A suppressor circuit or protective circuit, for example, made of suppressor diodes (source to drain) can therefore be provided for overvoltage protection. There are cases, however, wherein the effective inductance in the short circuit is not actually known, and a design of the protective circuit is therefore difficult. Because of the channel resistance of the suppressor diodes, the critical energy for the suppressor diode can also be overcome in the event of high short-circuit currents. The suppressor diode can be destroyed thereby and then no longer offers protection for the MOSFET switch.

In the approach presented herein is introduced a diagnostic possibility with which the damage can be detected. In one form, a sample & hold link is connected in parallel to the MOSFET channel and the suppressor diode. The tapped signal is digitized and supplied to a decision-making step in a microprocessor via an analog-digital converter stage. Damage to the suppressor diode can be diagnosed depending on the exceeding of predefined threshold values.

A redundant overvoltage safeguard of the MOSFETs (MOSFETs+suppressor) can be achieved in this way with diversity for channels having functional safety (FUSI channels). A defect of the suppressor diode due to an overvoltage event can thus be detected. This event can be reported to a superordinate system.

An electronic safeguard is comprised of a MOSFET switch Q1, the MOSFET activator, and a suppressor diode D1 connected in parallel to the MOSFET switch Q1. In the approach presented here, a sample-&-hold unit is connected in parallel to the MOSFET channel Q1 and the suppressor diode D1. The sample-&-hold unit is comprised of a diode D2, a resistor R1, and a capacitor C1. An evaluating unit having an analog-digital converter is connected in parallel to the capacitor C1 of the sample-&-hold unit. The evaluating unit can be configured discretely or in a microprocessor.

A load L1 connected to the MOSFET switch Q1 via a wire harness consumer can be switched on or switched off via the MOSFET Q1. With further functions such as a drain-source voltage measurement, a control system of the MOSFET Q1 can be expanded into an intelligent electronic safeguard (eFuse).

Voltages are induced via the drain-source segment, which can violate a safe operating area (Safe Operating Area) of the MOSFET Q1 and lead to its thermal destruction with the switching off of inductive loads. Typical values for the drain-source voltage strength UDSmax for this application are 40V. In order to protect the MOSFET Q1, a suppressor diode D1, which can reliably degrade the induced voltage curves defined by the wire harness consumer and the load L1, is connected in parallel to the MOSFET Q1. The breakdown voltage UBr of the suppressor diode D1 (typically 32V) is below the voltage UDSmax by a safety distance. The occurring peak voltage Uc is measured using the sample-&-hold link connected in parallel and the evaluating unit. The sample-&-hold circuit ensures that the maximum occurring peak voltage Uc is also then measured when the reaching of the maximum peak voltage Uc and the sample time point do not directly coincide. In normal operation, the occurring overvoltage during the switching off of the inductive load L1 is reduced to the value of the breakdown voltage UBr. The evaluating unit always measures the voltage value UBr between P1 and P2. If the load case, consisting of the wiring harness consumer and the load L1, changes due to unforeseeable events to the disadvantage of the original design, the suppressor diode D1 can be or is destroyed and the voltage increases to approximately UDSmax+5V, that is 45V, and is then limited by an avalanche breakdown (avalanche) of the MOSFET Q1. After the occurrence of an overload switch-off process, the microcontroller (µC) of the evaluating unit measures the differential voltage between P1 and P2 after each switch-off process via the analog-digital converter (ADC). The destruction of the suppressor diode D1 can be diagnosed. In the normal load-free switch-off case, the measured voltage Uc will be identical to the battery voltage (e.g., 12V). UBr is measured in the load switch-off case without fault. In the case of a destruction of the suppressor diode D1, the measured voltage will be 45V.

It can be assumed with high probability that it is a multi-point error if the suppressor diode D1 fails due to overload, and the MOSFET Q1 simultaneously fails in the avalanche breakdown (avalanche). In the case of the failure of the protective circuit with a proper design, the MOSFET Q1 can switch off once more without short-circuiting by alloying, but it would then be previously damaged. The approach presented herein makes now possible the detection of the latent fault of the failure of the protective circuit. The channel having the MOSFET Q1 is no longer activated after the fault of the protective circuit is detected by a superordinate logic.

Only if a permanently low-resistance fault of the load L1 leads to the critical situation, can then a differential measurement P1 to P2 be omitted, and only a measurement at P1 is sufficient, since P2 with the fault lies at ground potential.

Since the devices and methods described above in detail are example forms, they can be modified to a wide extent in a conventional manner by the person skilled in the art without abandoning the field of the present disclosure. Especially the mechanical assemblies and the size ratios of the individual elements with respect to one another are only exemplary.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for monitoring a switchable semiconductor component having a protective circuit connected in parallel to the semiconductor component, the method comprising:
    tapping an electrical variable applied to the semiconductor component and the protective circuit; and
    detecting damage to at least one of the semiconductor component and the protective circuit when the electrical variable is greater than a previously known critical value,
    wherein the protective circuit comprises a suppressor diode, and the method further comprises:
    tapping an electrical voltage at the suppressor diode connected in parallel to the semiconductor component; and
    detecting damage to the suppressor diode when the electrical voltage is greater than a breakdown voltage plus a permitted voltage tolerance of the suppressor diode.

2. The method according to claim 1 further comprising:
    storing a maximum of the electrical variable during a switch off of the semiconductor component using a storage device connected in parallel to the semiconductor component and the protective circuit,
    wherein the maximum is tapped in a delayed manner at the storage device, and the damage is detected when the maximum is greater than the critical value.

3. The method according to claim 1 further comprising emitting a damage message when the damage is detected.

4. The method according to claim 1 further comprising inhibiting a future use of the semiconductor component by a blocking note to a control system of the semiconductor component when the damage is detected.

5. The method according to claim 1, wherein the damage to the suppressor diode is detected when the electrical voltage is greater by a voltage tolerance than the breakdown voltage plus a permitted voltage tolerance of the suppressor diode.

6. A method for monitoring a switchable semiconductor component having a protective circuit connected in parallel to the semiconductor component, the method comprising:
  tapping an electrical variable applied to the semiconductor component and the protective circuit; and
  detecting damage to at least one of the semiconductor component and the protective circuit when the electrical variable is greater than a previously known critical value,
  wherein the damage to the semiconductor component is detected when an electrical voltage is greater by a tolerance than a dielectric strength of the semiconductor component.

7. A monitoring device for a semiconductor component, the monitoring device comprising:
  a protective circuit connected in parallel to the semiconductor component;
  a tapping device configured to tap an electrical variable applied to the semiconductor component and the protective circuit; and
  an evaluating device configured to compare the electrical variable to a known critical value to detect damage to at least one of the semiconductor component and the protective circuit,
  wherein the damage to the semiconductor component is detected when an electrical voltage is greater by a tolerance than a dielectric strength of the semiconductor component.

8. The monitoring device according to claim 7, further comprising:
  a storage device for storing a maximum of the electrical variable,
  wherein the tapping device is connected in parallel to a storage component of the storage device, and is configured to tap, as the electrical variable, the maximum stored in the storage component in a time-delayed manner.

9. The monitoring device according to claim 8, wherein the storage device has a diode connected in parallel to a resistor, wherein the storage component is a capacitor connected in series to the diode and the resistor.

* * * * *